(12) United States Patent
Peczalski et al.

(10) Patent No.: US 7,126,330 B2
(45) Date of Patent: Oct. 24, 2006

(54) INTEGRATED THREE-DIMENSIONAL MAGNETIC SENSING DEVICE AND METHOD TO FABRICATE AN INTEGRATED THREE-DIMENSIONAL MAGNETIC SENSING DEVICE

(75) Inventors: Andrzej Peczalski, Eden Prairie, MN (US); James F Detry, Plymouth, MN (US); Hong Wan, Plymouth, MN (US); William F Witcraft, Minneapolis, MN (US)

(73) Assignee: Honeywell International, Inc., Morristown, NJ (US)

( * ) Notice: Subject to any disclaimer, the term of this patent is extended or adjusted under 35 U.S.C. 154(b) by 144 days.

(21) Appl. No.: 10/860,744

(22) Filed: Jun. 3, 2004

(65) Prior Publication Data

US 2005/0270020 A1 Dec. 8, 2005

(51) Int. Cl.
*G01R 33/02* (2006.01)
*G01R 33/09* (2006.01)

(52) U.S. Cl. ..................... 324/247; 324/252
(58) Field of Classification Search ............... 324/247, 324/251, 249, 252, 260, 262, 244; 338/32 R
See application file for complete search history.

(56) References Cited

U.S. PATENT DOCUMENTS

| | | | |
|---|---|---|---|
| 4,441,072 A | 4/1984 | Rahman | 323/368 |
| 4,533,872 A | 8/1985 | Boord et al. | 324/252 |
| 4,681,812 A | 7/1987 | Scheutz | 428/432 |
| 4,847,584 A * | 7/1989 | Pant | 338/32 R |
| 4,857,418 A | 8/1989 | Scheutz | 428/693 |
| 4,945,397 A | 7/1990 | Scheutz | 357/71 |
| 5,019,461 A | 5/1991 | Scheutz | 428/688 |
| 5,247,278 A | 9/1993 | Pant et al. | 338/32 |
| 5,260,225 A | 11/1993 | Liu et al. | 437/3 |
| 5,317,251 A | 5/1994 | Haviland et al. | 324/102 |
| 5,351,028 A | 9/1994 | Krahn | 338/32 |
| 5,500,590 A | 3/1996 | Pant | 324/252 |
| 5,539,241 A | 7/1996 | Abidi et al. | 257/531 |
| 5,583,436 A * | 12/1996 | Van De Walle et al. | 324/252 |
| 5,589,769 A | 12/1996 | Krahn | 324/207.26 |
| 5,644,230 A | 7/1997 | Pant et al. | 324/247 |

(Continued)

OTHER PUBLICATIONS

William R. Gondin, Ph.D, and Bernard Sohmer, Doubleday Publishing Group, Inc., "*Intermediate Algebra and Analytic Geometry Made Simple*," 1950.

(Continued)

*Primary Examiner*—Edward Lefkowitz
*Assistant Examiner*—Kenneth J. Whittington
(74) *Attorney, Agent, or Firm*—McDonnell Boehnen Hulbert & Berghoff LLP

(57) ABSTRACT

An integrated three-dimensional magnetic or any field sensing device and a method to fabricate an integrated three-dimensional magnetic sensing device is presented. An integrated three-dimensional magnetic sensing device comprises an apparatus that defines at least a first surface area and at least one sloped surface which is sloped with respect to the first surface area. Two magnetic sensing units could be arranged on the first surface area to provide first and second orthogonal sensing directions, and a third magnetic sensing unit could be arranged on the at least one sloped surface to provide sensing in at least a third sensing direction which is orthogonal to the first and second orthogonal sensing directions. Bias could be applied to the third magnetic sensing unit to cancel a component of the magnetic field sensed by the third magnetic sensing unit so that the third magnetic sensor unit only provides sensing in the third direction.

21 Claims, 7 Drawing Sheets

U.S. PATENT DOCUMENTS

| | | | |
|---|---|---|---|
| 5,820,924 A | 10/1998 | Witcraft et al. | 427/130 |
| 5,952,825 A | 9/1999 | Wan | 324/252 |
| 5,982,178 A | 11/1999 | Pant et al. | 324/252 |
| 6,097,183 A | 8/2000 | Goetz et al. | 324/207.21 |
| 6,160,395 A | 12/2000 | Goetz et al. | 324/207.21 |
| 6,169,254 B1 | 1/2001 | Pant et al. | 174/254 |
| 6,232,776 B1 | 5/2001 | Pant et al. | 324/252 |
| 6,276,203 B1 | 8/2001 | Hulsing, II | 73/504.03 |
| 6,301,795 B1 | 10/2001 | Kang | 33/366.12 |
| 6,376,933 B1 | 4/2002 | Goetz et al. | 307/91 |
| 6,504,366 B1 | 1/2003 | Bodin et al. | 324/247 |
| 6,529,114 B1 | 3/2003 | Bohlinger et al. | 338/32 |
| 6,536,123 B1 | 3/2003 | Tamura | 33/356 |
| 6,578,420 B1 | 6/2003 | Hsu | 73/504.16 |
| 6,674,280 B1 | 1/2004 | Goetz et al. | 324/207.21 |
| 6,700,371 B1 | 3/2004 | Witcraft et al. | 324/252 |
| 6,717,403 B1 | 4/2004 | Witcraft et al. | 324/252 |
| 2002/0166893 A1 | 11/2002 | Li et al. | 235/454 |
| 2003/0016011 A1 | 1/2003 | Witcraft et al. | 324/252 |
| 2003/0045044 A1 | 3/2003 | Detry et al. | 438/200 |
| 2003/0151406 A1 | 8/2003 | Wan et al. | 324/252 |
| 2003/0207579 A1 | 11/2003 | Rattner | 438/700 |
| 2004/0012895 A1 | 1/2004 | Drewes et al. | 360/324.1 |
| 2004/0019272 A1 | 1/2004 | Witcraft | 600/410 |
| 2004/0103530 A1* | 6/2004 | Adachi et al. | 29/854 |
| 2005/0017714 A1* | 1/2005 | Beichler et al. | 324/247 |

OTHER PUBLICATIONS

Kawahito et al., "Micromachined Hall Elements for Two-Dimensional Magnetic-Field Sensing," Sensors and Actuators A, Elsevier Sequoia S.A., Lausanne, CH, vol. A40, No. 2., pp. 141-146 Feb. 2004.

International Search Report PCT/US2005/019331 (Mailed Jan. 26, 2006).

* cited by examiner

INTEGRATED THREE-DIMENSIONAL MAGNETIC SENSING DEVICE AND METHOD TO FABRICATE AN INTEGRATED THREE-DIMENSIONAL MAGNETIC SENSING DEVICE

BACKGROUND

1. Field of Invention

The present invention relates generally to magnetic sensing devices, and more particularly to the arrangement of magnetic sensor units in a magnetic sensing device.

2. Description of Related Art

Magnetic sensing devices facilitate the measurement of a magnetic field (i.e. one or more magnetic fields) for a variety of applications by using one or more magnetic sensor units to sense the magnetic field, and to provide output signals that represent the magnetic field. Navigation applications that determine a heading determination are popular applications for magnetic sensing devices. A heading determination may indicate a direction, such as North or North-East. Other applications for magnetic sensing devices, such as proximity detection, are also possible.

The one or more magnetic sensor units in a magnetic sensing device may be arranged in a manner that provides sensing of particular components of a magnetic field. For example, a first magnetic sensor unit may be arranged to sense a component of a magnetic field in a direction defined as the x-axis direction, and a second magnetic sensor unit may be arranged to sense a component of the magnetic field in a direction defined as the y-axis direction. In this example, the magnetic sensing device could have a first output to provide an output signal that represents components of the magnetic field in the x-axis direction and a second output to provide an output signal that represents components of the magnetic field in the y-axis direction.

A wide variety of magnetic sensor unit types are available such as reed switches, variable reluctance sensors, flux-gate magnetometers, magneto-inductor sensors, spin-tunnel device sensors, and Hall-Effect sensors. Another magnetic sensor unit type is a magnetic sensor unit that comprises magnetoresistive material. Examples of magnetic sensors comprising magnetoresistive material include giant magneto-resistive sensors and giant magneto-impedance sensors. Other examples are also possible.

Magnetoresistive material is a material with a variable resistance value that varies depending in part on a magnetic field in proximity to the magnetoresistive material. The sensitivity of magnetoresistive material to change its resistance value when exposed to a magnetic field depends in part on the characteristics of a particular magnetoresistive material. Common magnetoresistive materials include anisotropic magnetoresistive (AMR) materials and giant magnetoresistive (GMR) materials which are both described in U.S. Pat. No. 5,569,544 and colossal magnetoresistive (CMR) materials described in U.S. Pat. No. 5,982,178.

One type of AMR material is a nickel-iron material known as Permalloy. AMR-type magnetic sensor units may include thin films of Permalloy deposited on a silicon wafer and patterned as a resistor. Multiple resistors made of Permalloy may be coupled together to form an electrical circuit. The electrical circuit could take the form of a bridge configuration, such as a Wheatstone bridge configuration.

FIG. 1 illustrates a magnetic sensor unit 10 that includes a first resistor 12, a second resistor 14, a third resistor 16, and a fourth resistor 18 coupled together in a Wheatstone bridge configuration. First ends of the first and second resistors 12 and 14 are connected to a common power source 20, such as a voltage source supplying a positive voltage. First ends of the third and fourth resistors 16 and 18 are connected to a common ground source 22. Second ends of the first and third resistors 12 and 16 are connected to a first input of an amplifier 24 and second ends of the second and fourth resistors 14 and 18 are connected to a second input of the amplifier 24. The amplifier 24 produces an output (V out) which is an amplified differential signal.

The resistance values of the first, second, third, and fourth resistors 12, 14, 16, 18 are typically chosen to be equivalent resistance values. The first, second, third, and fourth resistors 12, 14, 16, 18 could be made with a magnetoresistive material.

During fabrication of AMR-type magnetic sensor units, the AMR magnetoresistive material is deposited on a silicon substrate in the presence of a strong magnetic field. This strong magnetic field sets a magnetization vector in the AMR magnetoresistive material resistor to be parallel to the length of the resistor by aligning the magnetic domains of the AMR magnetoresistive material in the same direction. Magnetic domains are clusters of atoms within the AMR magnetoresistive material with their magnetic moment pointing in the same direction.

FIG. 2 illustrates a plan view of a strip of AMR magnetoresistive material 40 having a magnetization vector 42 in a first direction. A current 43 could pass through the strip 40, from a first side 44 of strip 40 to a second side 45 of strip 40, at an angle 46 in relation to the magnetization vector 42 when no magnetic field is applied to the strip 40, by placing conductive straps, such as conductive straps 47, 48, across the strip 40 at an angle 49. The angle between the current 43 and the magnetization vector 42 occurs, in part, because of the angle 49 formed by the conductive straps 47, 48 placed across strip 40. Angle 46 is preferably about 45° when there is no magnetic field applied to the strip 40.

For the current 43 to pass through strip 40 at the preferred angle 46 of about 45°, angle 49 is also 45°. Angle 49 is formed between each of the conductive straps 47, 48 and a side 50 of the magnetoresistive strip 40 as shown in FIGS. 2 and 3. The current 43 passes through strip 40 in a direction that is substantially perpendicular to the conductive straps 47, 48. The number of conductive straps placed across strip 40 could be greater than or less than the two straps shown in FIGS. 2 and 3.

Conductive strap 47 is an example of one of the conductive straps across strip 40. U.S. Pat. No. 4,847,584 describes the placement of conductive straps on magnetoresistive material.

FIG. 3 illustrates a plan view of strip 40 when a magnetic field 52 is applied normal (perpendicular) to a side 50 of strip 40. The current 43 continues to pass through the strip 40 in the same direction as the current 43 in FIG. 2 due to the orientation of the conductive strap 48 and others conductive straps similarly placed across the strip 40. However, the magnetic field 52 causes the magnetization vector 54 to rotate.

The rotation of the magnetization vector 54, in this case, causes the size of angle 56 formed between the current 43 and the magnetization vector 54 to decrease with respect to the size of angle 46. As the size of angle 56 decreases the resistance of the strip 40 increases. Other arrangements of the strip 40 and the conductive straps 47, 48 could cause the size of angle 56 to increase which decreases the resistance of the strip 40.

Magnetic sensing devices are available in a variety of one-axis and two-axis configurations. The number of axes in a magnetic sensing device refers to the number of sensitive axes or sensing directions for measuring a magnetic field. Magnetic sensing devices with more than one axis typically arrange the multiple axes to be mutually orthogonal. Some forms of three-axis magnetic sensing devices are available but not in the integrated form as described below.

SUMMARY

The present invention provides for an integrated three dimensional magnetic sensing device and a method to fabricate a three-dimensional magnetic sensing device.

In one respect, an exemplary embodiment of the invention may take the form of an integrated three-dimensional magnetic sensing device that comprises (i) a first magnetic sensor unit and a second sensor unit formed in a common plane on a single substrate, and (ii) a third magnetic sensor formed on a sloped surface with respect to the common plane. The single substrate defines the sloped surface with respect to the common plane.

In this exemplary embodiment, the first magnetic sensor unit is arranged to sense a component of a magnetic field in a first direction, the second magnetic sensor unit is arranged to sense a component of the magnetic field in a second direction, and the third magnetic sensor unit is arranged to a sense component of the magnetic field in a third direction. The first, second, and third directions are mutually orthogonal.

In another respect, the exemplary embodiment may take the form of an integrated three-dimensional magnetic sensing device that comprises (i) a first magnetic sensor unit formed on a first surface area of a single substrate, (ii) a second magnetic sensor unit formed on a second surface area of the single substrate, and (iii) a third magnetic sensor unit formed at least in part on first and second surfaces sloped with respect to the first and second surface areas of the single substrate.

In this exemplary embodiment, the first magnetic sensor unit is arranged to sense a component of a magnetic field in a first direction, the second magnetic sensor unit is arranged to sense a component of the magnetic field in a second direction, and the third magnetic sensor unit is arranged to sense a component of the magnetic field in a third direction. The first second, and third directions are mutually orthogonal.

In yet another respect, the exemplary embodiment could take the form of a method of fabricating an integrated three-dimensional magnetic sensing device, where the method includes the functions of (i) forming a first magnetic sensor unit on a first surface area of a single substrate, (ii) forming a second magnetic sensor unit on a second surface area of the single substrate, and (iii) forming a third magnetic sensor unit on at least one sloped surface of the single substrate. The sloped surface is sloped with respect to the first and second surface areas. Forming the first, second and third magnetic sensor units includes arranging the first, second, and third magnetic sensor units in such a way that the first, second, and third magnetic sensor units sense components magnetic field components in mutually orthogonal directions.

These as well as other aspects and advantages of the invention will become apparent to those of ordinary skill in the art by reading the following detailed description, with reference where appropriate to the accompanying drawings. Further, it should be understood that the embodiments noted in this summary are not intended to limit the scope of the invention as claimed.

BRIEF DESCRIPTION OF THE DRAWINGS

An exemplary embodiment of the present invention is described herein with reference to the drawings, in which.

DETAILED DESCRIPTION

1. Overview

Figure 4:
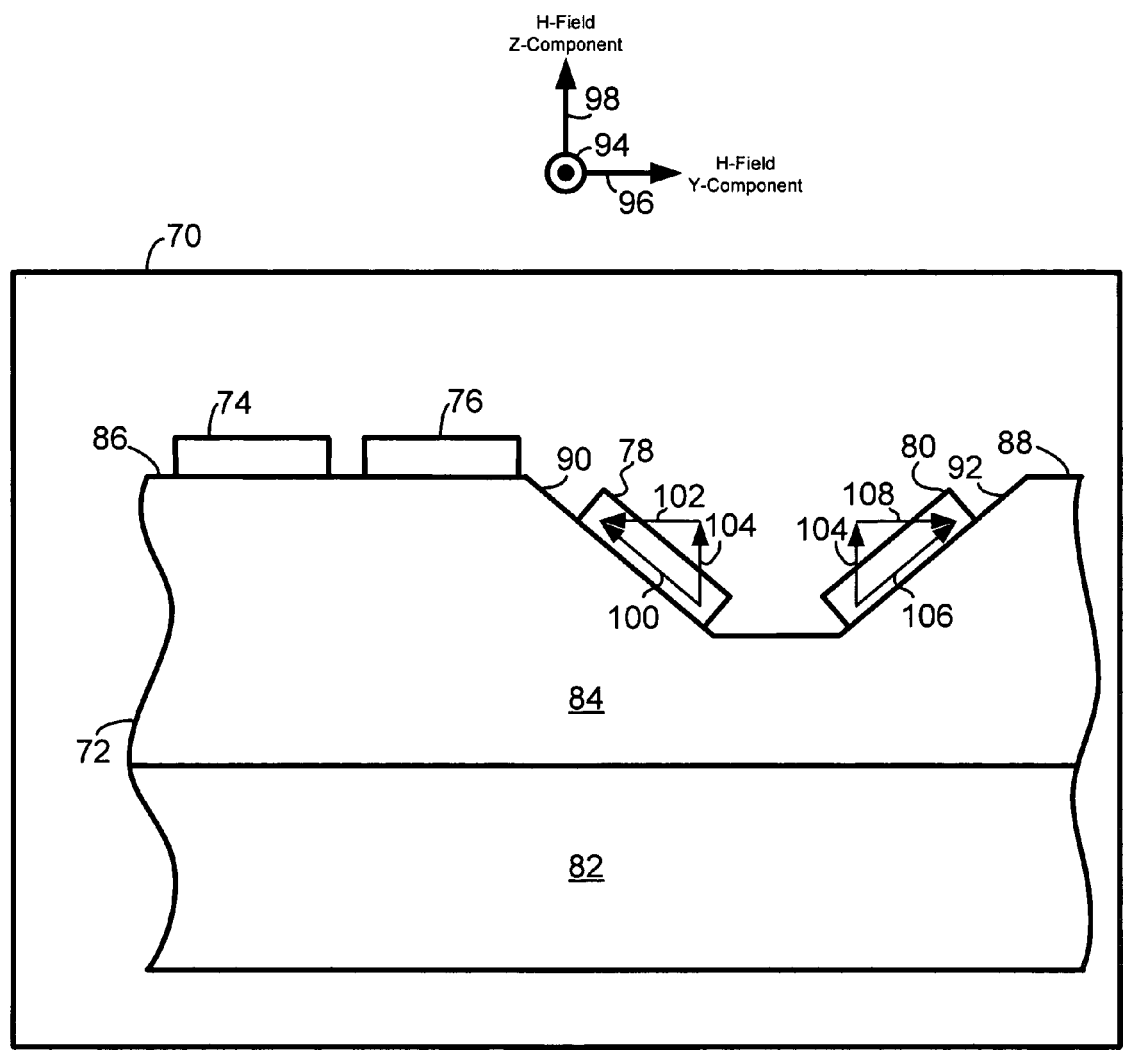
FIG. 4 illustrates a sectional view of an exemplary integrated three-dimensional magnetic sensing device.

A simplified sectional view of an exemplary embodiment of an integrated three-dimensional magnetic sensing device 70 is shown in FIG. 4. The integrated three-dimensional magnetic sensing device 70 includes a single substrate 72, a first magnetic sensor unit 74, a second magnetic sensor unit 76, a first segment of a third magnetic sensor unit 78, and a second segment of the third magnetic sensor unit 80. The first magnetic sensor unit 74, the second magnetic sensor unit 76, and the first and second segments of the third magnetic sensor unit 78 and 80, are all formed on the single substrate 72.

The single substrate 72 comprises a first layer 82 and a second layer 84. The first layer 82 provides support for the second layer 84, the first and second magnetic sensor units 74 and 76, and the first and second segments of the third magnetic sensor unit 78 and 80.

The first layer 82 could be a substrate comprising silicon, germanium, glass, plastic or some other suitable material. A substrate is a material on which another material is coated or fabricated. An exemplary substrate is a semiconductor die. A semiconductor die is one unit of a wafer of semiconductor material separated by scribe lines. Common semiconductor material includes silicon and germanium.

The second layer 84 could comprise silicon, silicon dioxide ($SiO_2$), plastic or some other material suitable for arranging on the first layer 82 and for supporting the first and second magnetic sensor units 74 and 76, and the first and second segments of the third magnetic sensor unit 78 and 80.

The single substrate 72 could include more layers or fewer layers than the two layers shown in FIG. 4. The first and second magnetic sensor units 74 and 76, and the first and second segments of the third magnetic sensor unit 78 and 80 could also be arranged on the first layer 82 or on some other layer (not shown) of the single substrate 72.

The second layer 84 of the single substrate 72 defines a first surface 86, a second surface 88, a third surface 90, and a fourth surface 92. The third and fourth surfaces 90 and 92 are sloped with respect to the first and second surfaces 86 and 88. A grade is the degree of inclination of a sloped surface.

The first and second surfaces 86 and 88 could reside in a common plane defined by the single substrate 72. The grade of the third surface 90, with respect to the first surface 86, is preferably equal in magnitude to the grade of the fourth surface 92, with respect to the second surface 88, when the first and second surfaces 86 and 88 reside in a common plane. The first and second surfaces 86 and 88 could also be arranged in different planes, which are parallel or non-parallel. Then the grade (angle) of surface 90, with respect to the first surface 86, should be equal to ninety degrees minus the grade (angle) of surface 92 with respect to the first surface 86.

The first and second magnetic sensor units 74 and 76 are formed on surface 86. The first segment of the third magnetic sensor unit 78 is formed on the third surface 90 and the second segment of the third magnetic sensor unit 80 is formed on the fourth surface 92.

The three dimensions of the three-dimensional magnetic sensing device 70 are achieved by sensing three mutually orthogonal components of a magnetic field. Three mutually orthogonal components of a magnetic field could include an x-axis component 94, a y-axis component 96, and a z-axis component 98.

In the exemplary embodiment, the first magnetic sensor unit 74 could be arranged to sense a magnetic field in the direction of the x-axis component 94, the second magnetic sensor unit 76 could be arranged to sense the magnetic field in the direction of the y-axis component 96, and the first and second segments of the third magnetic sensor unit 78 and 80 could be arranged to sense the magnetic field in at least the direction of the z-axis component 98.

For example, the first segment of the third magnetic sensor unit 78 could be sensitive in a direction 100 that is parallel to the first segment of the third magnetic sensor unit 78 and the sloped surface 90. A component of a magnetic field in direction 100 comprises magnetic field components in a horizontal direction 102 and a vertical direction 104. Also, the second segment of the third magnetic sensor unit 80 could be sensitive in a direction 106 that is parallel to the second segment of third magnetic sensor unit 80 and the sloped surface 92. Components of a magnetic field in direction 106 include magnetic field components in a horizontal direction 108 and the vertical direction 104.

A biasing means, described below, provides a biasing effect so that the magnetic field component in the horizontal direction 102 cancels the magnetic field component in the horizontal direction 108. A result of the biasing effect is that the first and second segments of the third magnetic sensor 78 and 80 effectively provide magnetic field sensing in the vertical direction 104.

Figure 5:
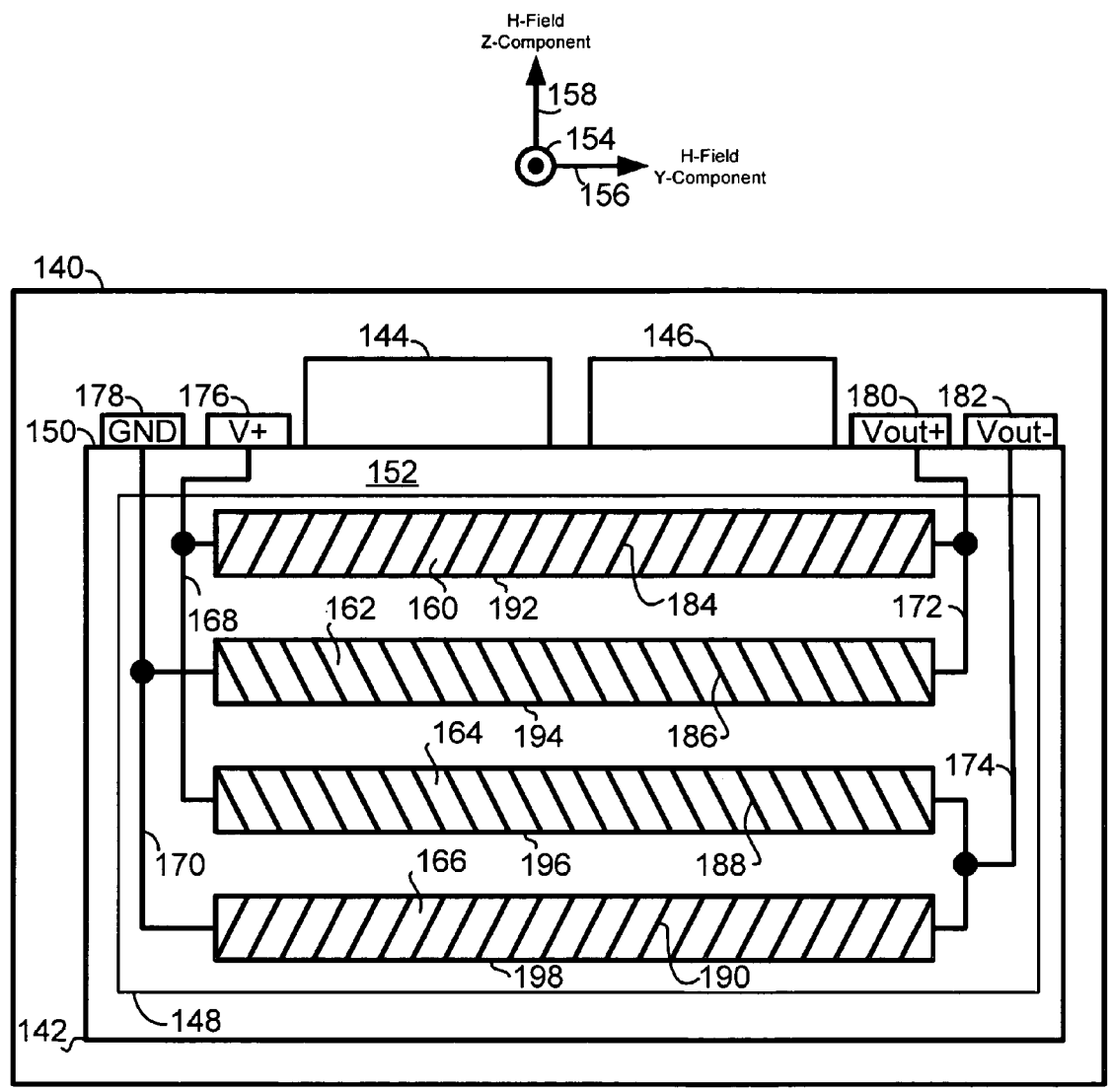
FIG. 5 depicts a schematic view of an exemplary integrated three-dimensional magnetic sensing device with a magnetic sensor unit on a single sloped surface.

2. Exemplary Integrated Three-Dimensional Magnetic Sensing Device Using a Single Sloped Surface FIG. 5 illustrates a schematic view of an exemplary integrated three-dimensional magnetic sensing device 140 that includes a single apparatus 142 for arranging a first magnetic sensor unit 144, a second magnetic sensor unit 146, and a third magnetic sensor unit 148. The single apparatus 142 could take various forms. For example, the single apparatus 142 could comprise a single substrate made of silicon, germanium, or some other material (i.e. one or more materials). Another example of the single apparatus 142 is a monolithic substrate made of silicon, glass, or some other material.

The first, second, and third magnetic sensor units 144, 146, and 148 could comprise one of a variety of magnetic sensor configurations. For example, the first, second, and third magnetic sensor units 144, 146, and 148 could each comprise a Hall-Effect magnetic sensor, a spin tunnel device sensor, a magnetoresistive sensor comprising magnetoresistive material, such as AMR, GMR, or CMR, a giant magneto-impedance sensor, or a flux gate sensor. Alternatively, the sensor formed on the single apparatus 142 could be a sensor that senses one of a variety of physical vector quantities besides magnetic fields. Physical vector quantities are physical quantities that can defined as a vector, a quantity having both a magnitude and a direction. Examples of other physical vector quantities include gravity fields and electric fields.

A magnetic sensor unit that comprises magnetoresistive material may comprise a plurality of magnetoresistive strips and a plurality of interconnections that couple the plurality of magnetoresistive strips to form an electrical circuit. The electrical circuit may be arranged in a bridge configuration such as a Wheatstone bridge configuration. Other configurations for the electrical circuit are also possible.

The single apparatus 142 could define a plurality of surfaces and a plurality of planes for arranging the first, second, and third magnetic sensor units 144, 146, and 148. For example, the single apparatus could define a common plane (not shown) that includes the surface 150 that is orthogonal to the page. The first and second magnetic sensor units 144 and 146 could be arranged on surface 150 so that the first and second magnetic sensor units 144 and 146 are formed in the common plane on the single apparatus 142. Alternatively, the first and second magnetic sensor units 144 and 146 could be formed on two or more surfaces such that the first and second magnetic sensor units 144 and 146 are not formed in a common plane on the single apparatus 142.

The single apparatus 142 also defines a sloped surface 152 which is sloped with respect to the surface 150 as well as with respect to the common plane that comprises the first and second magnetic sensor units 144 and 146. The third magnetic sensor unit 148 is formed on the sloped surface 152. The degree of inclination of the sloped surface 152 could be a range of degrees that depends in part on the material of the single apparatus 142. The degree of inclination of the sloped surface 152 could also depend on a process used to develop the sloped surface 152.

The first magnetic sensor unit 144 is arranged to sense a component of a magnetic field in a first direction, such as the x-axis direction 154. The first magnetic sensor unit 144 may comprise an output that provides an output signal representing the component of the magnetic field in the first direction.

The second magnetic sensor unit 146 is arranged to sense a component of a magnetic field in a second direction, such as the y-axis direction 156. The second magnetic sensor unit 146 may comprise an output that provides an output signal representing the component of the magnetic field in the second direction.

The third magnetic sensor unit 148 is arranged to sense a component of a magnetic field in a third direction, such as the z-axis direction 158. The third magnetic sensor unit 148 may comprise an output that provides an output signal representing at least in part the component of the magnetic field in the third direction and at least in part a component of the magnetic field in another direction, such as the first or second directions. The first, second, and third directions 154, 156, and 158 are mutually orthogonal.

In the exemplary embodiment, the third magnetic sensor unit 148 comprises four magnetoresistive strips 160, 162, 164, and 166 and interconnections 168, 170, 172, and 174. Interconnection 168 is coupled to a terminal 176, such as a bonding pad in order to couple a power source (not shown) to the terminal 176. Interconnection 170 is coupled to a terminal 178, such as a bonding pad in order to couple a ground source to the terminal 178. Interconnections could comprise a conductive material such as copper or aluminum in an appropriate size to handle the current that flows through the interconnections 168, 170, 172, and 174 and the magnetoresistive strips 160, 162, 164, and 166.

Interconnection 172 couples magnetoresistive strips 160 and 162, which allows a current to flow through the magnetoresistive strips 160 and 162, such as when a voltage is supplied at terminal 176. Interconnection 174 couples magnetoresistive strips 164 and 166, which allows a current to flow through the magnetoresistive strips 164 and 166, such as when a voltage is supplied at terminal 176.

Interconnection 172 is also coupled to a terminal 180 and interconnection 174 is also coupled to a terminal 182. Terminals 180 and 182 could be bonding pads. Terminals 180 and 182 could be coupled to a differential amplifier circuit to provide a differential output of the third magnetic sensor unit 148. A voltage difference between terminals 180 and 182 could be used to detect changes in resistance of the four magnetoresistive strips 160, 162, 164, and 166 when a magnetic field is applied to the third magnetic sensor unit 148.

The exemplary integrated three-dimensional magnetic sensing device 140 could also comprise a biasing means to orient current flow through the magnetoresistive strips 160, 162, 164, and 166 in a particular direction. An example of a biasing means is conductive straps arranged on a magnetoresistive strip at a given angle. Conductive straps 184, 186, 188, and 190 are examples of conductive straps arranged on magnetoresistive strips to form an angle of approximately 45° with respect to a long edge of each respective magnetoresistive strip, such as the long edges 192, 194, 196, 198 respectively.

Figure 6:
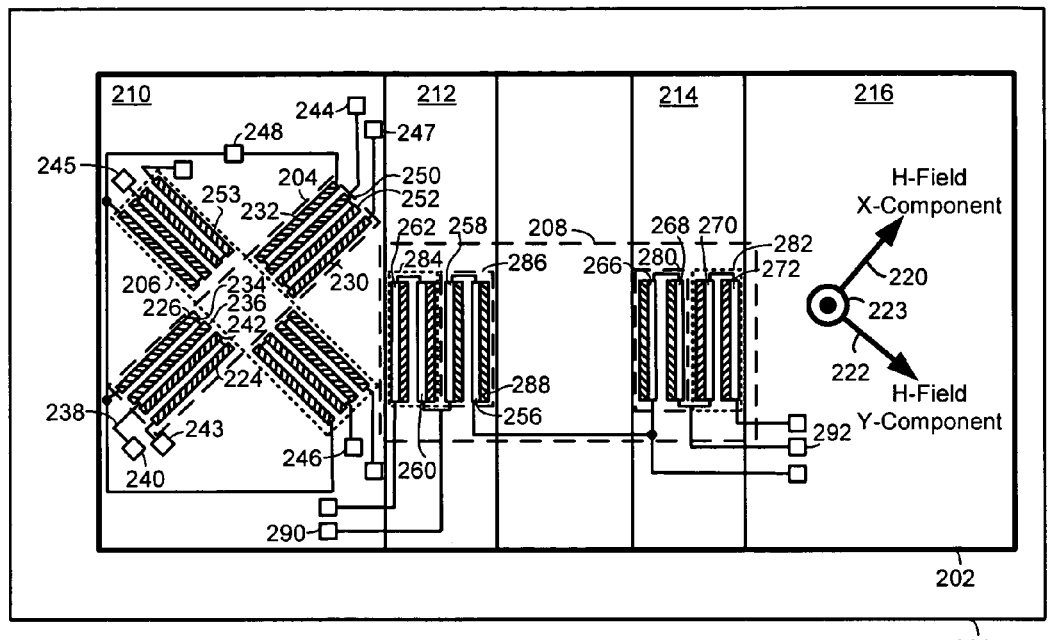
FIG. 6 illustrates an exemplary integrated three-dimensional magnetic sensing device with a magnetic sensor unit formed on at least two sloped surfaces.

3. Exemplary Integrated Three-Dimensional Magnetic Sensing Device Using More Than One Sloped Surface FIG. 6 illustrates a top plan view of an exemplary integrated three-axis magnetic sensing device 200 that includes a single apparatus 202 for arranging a first magnetic sensor unit 204, a second magnetic sensor unit 206, and a third magnetic sensor unit 208. The single apparatus 202 could take various forms. For example, the single apparatus 202 could comprise a single substrate made of silicon, germanium, or some other material or combination of materials. Another example of the single apparatus 202 is a monolithic substrate made of silicon, glass, or some other material or combination of materials.

The single apparatus 202 defines at least a surface 210, a sloped surface 212, a sloped surface 214, and surface 216. The first and second magnetic sensor units 204 and 206 are formed within a common plane 218 (FIG. 7) on surface 210. The surface 210 and surface 216 are located within the common plane 218. The sloped surfaces 212 and 214 are sloped with respect to surface 210, surface 216, and the common plane 218.

Alternatively, the first magnetic sensor unit 204 could be formed in a first plane (not shown) on a first surface (not shown) defined by the single apparatus 202. Furthermore, the second magnetic sensor unit 206 could be formed in a second plane (not shown) on a second surface (not shown) defined by the single apparatus 202. The first and second planes could be parallel planes. In this alternative embodiment, the apparatus defines sloped surface 212 and sloped surface 214 which could be sloped with respect to the parallel planes.

The first magnetic sensor unit 206 is arranged to sense a component of a magnetic field in a first direction, which for convenience will be called the x-axis direction 220. The second magnetic sensor unit 204 is arranged to sense a component of a magnetic field in a second direction, which for convenience will be called the y-axis direction 222. Preferably the x-axis direction 220 and the y-axis direction 222 will be orthogonal and within the common plane 218 and 210. The third magnetic sensor 208 is arranged to sense a component of the magnetic field in at least third and fourth directions in order to provide an output signal that comprises a component of the magnetic field in a fifth direction, which for convenience will be called the z-axis direction 223.

The first, second, and third magnetic sensor units 204, 206, and 208 could comprise one of a variety of magnetic sensor configurations. For example, the first, second, and third magnetic sensor units 204, 206, and 208 could each comprise a Hall-Effect magnetic sensor, a spin tunnel device sensor, a magnetoresistive sensor comprising magnetoresistive material, such as AMR, GMR, or CMR, a giant magneto-impedance sensor, or a flux gate sensor. Alternatively, the first, second, and third magnetic sensor units 204, 206, 208 could each comprise a sensor that senses one of a variety of physical vector quantities besides magnetic fields (e.g., gravity fields or electric fields).

In the exemplary embodiment, the first magnetic sensor unit 204 comprises a plurality of magnetoresistive strips such as magnetoresistive strips 224, 226, 230, 232. The magnetoresistive strips 224, 228, 230, 232 are elongated strips of magnetoresistive material that are sensitive to a component of a magnetic field applied in a direction normal to a long side of the magnetoresistive strips 224, 226, 230, 232.

The first magnetic sensor unit 204 also comprises interconnections such as (i) interconnection 234 which couples magnetoresistive strip 226 to magnetoresistive strip 236, and (ii) interconnection 238 which couples magnetoresistive strip 236, bonding pad 240, and magnetoresistive strip 242. The first magnetic sensor unit 204 comprises a first electrical circuit that includes a first set of interconnections, including interconnections 234, 238 to couple magnetoresistive strips 224, 226, 230, 232, 236, 242, 250, 252 and bonding pads 240, 243, 244, 247, 248.

The first electrical circuit could be arranged in a variety of ways such as in a bridge configuration. In the exemplary embodiment, the first electrical circuit is arranged as a Wheatstone bridge where (i) bonding pads 243, 247 could be coupled to a power source for providing a voltage to the bonding pads 243, 247, (ii) bonding pad 248 could be coupled to a ground source, and (iii) bonding pads 240, 244 could be coupled to a first amplifier, such as amplifier 24, for sensing a difference in voltage between bonding pads 240, 244. The voltage between bonding pads 240, 244 is a first output signal of the first magnetic sensor unit 204 and the first output signal represents a magnetic field component in the y-axis direction 222.

The second magnetic sensor unit 206 is coupled to bonding pads 245, 246 which could be coupled to a second amplifier, for sensing a difference in voltage between bonding pads 245, 246. The voltage between bonding pads 245, 246 is a second output signal of the second magnetic sensor unit 206 and the second output signal represents a magnetic field component in the x-axis direction 220.

The second magnetic sensor unit 206 could also comprise a second plurality of magnetoresistive strips and a second set of interconnections to couple the second plurality of magnetoresistive strips as a second electrical circuit. The second electrical circuit could also be arranged in a variety of configurations including a bridge configuration such as a Wheatstone bridge configuration.

The third magnetic sensor unit 208 is formed at least in part on a first sloped surface 212 and a second sloped surface 214. The third magnetic sensor unit 208 could also comprise a third plurality of magnetoresistive strips and a third set of interconnections to couple the third plurality of magnetoresistive strips as a third electrical circuit. The third electrical circuit could also be arranged in a variety of configurations including a bridge configuration such as a Wheatstone bridge configuration.

Figure 7:
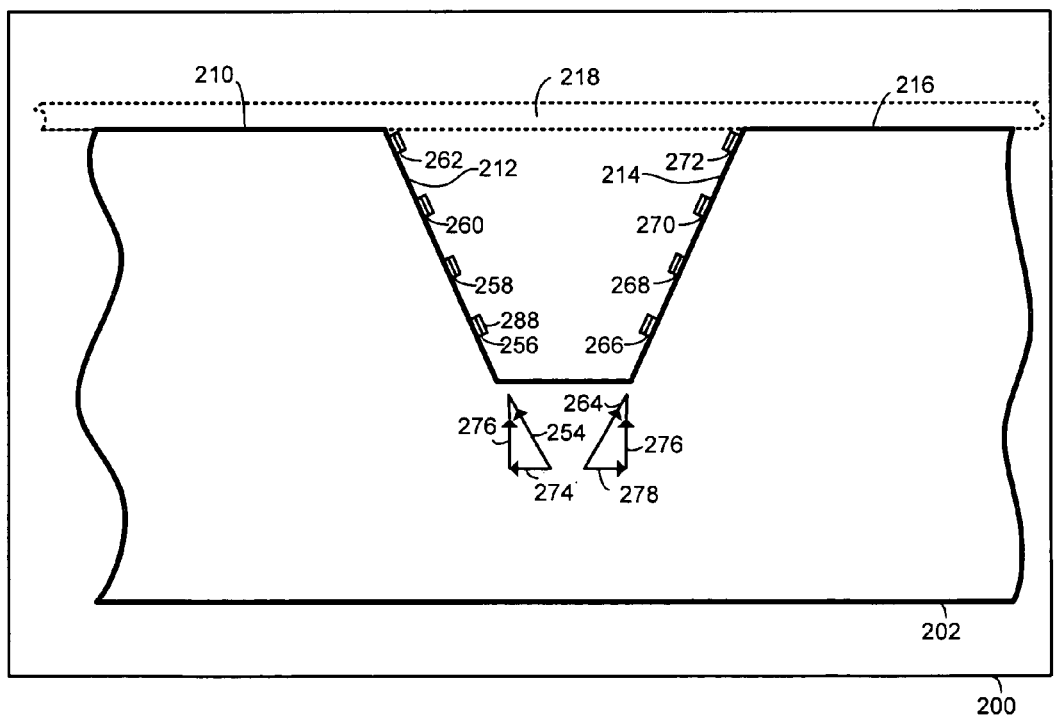
FIG. 7 illustrates a sectional view of the exemplary integrated three-dimensional magnetic sensing device shown in FIG. 6.

The third magnetic sensor unit 208 is arranged on the first sloped surface 212 and a second sloped surface 214 so that the third magnetic sensor unit 208 senses a component of a magnetic field in at least two directions. FIG. 7 illustrates (i) a first sensing direction 254 that is a direction normal to a side of magnetoresistive strips 256, 258, 260, 262 of the third magnetic sensor unit 208, and (ii) a second sensing direction 264 that is a direction normal to a side of magnetoresistive strips 266, 268, 270, 272.

A component of the magnetic field in the first sensing direction 254 comprises (i) a component of the magnetic field in a first parallel direction 274, where the first parallel direction is parallel to the surface 210, surface 216, and the common plane 218, and (ii) a component of the magnetic field in orthogonal direction 276, where the orthogonal direction 276 is orthogonal to the surface 210, surface 216, and the common plane 218.

A component of the magnetic field in the second sensing direction 264 comprises (i) a component of the magnetic field in a second parallel direction 278, where the second parallel direction is parallel to the surface 210, surface 216, and the common plane 218, and (ii) a component of the magnetic field in orthogonal direction 276.

In the exemplary embodiment, the electrical circuits of the first, second, and third magnetic sensor units 204, 206, 208 each comprise four bridge elements. The third magnetic sensor unit 208 comprises bridge elements 280, 282, 284, 286, each bridge element comprising two magnetoresistive strips. A bridge element may include fewer or more magnetoresistive strips as well.

Each of the first, second, and third magnetic sensor units 204, 206, 208 also comprise a first biasing means to change an angle between a magnetization vector of each of the four bridge element and the direction of current passing through each of the four bridge elements. In the exemplary embodiment, the first biasing means comprises a plurality of conductive straps on each magnetoresistive strip. Conductive strap 288 is an example of one conductive strap.

Each of the plurality of conductive straps extend across a portion of a magnetoresistive strip to form an angle of about 45° with respect to the long ends of each magnetoresistive strip. Placing the conductive straps at an angle of 45° provides a linear operating range for the first, second, and third magnetic sensor units 204, 206, 208. The conductive straps may comprise copper, aluminum, or some other conductive material.

Figure 1:
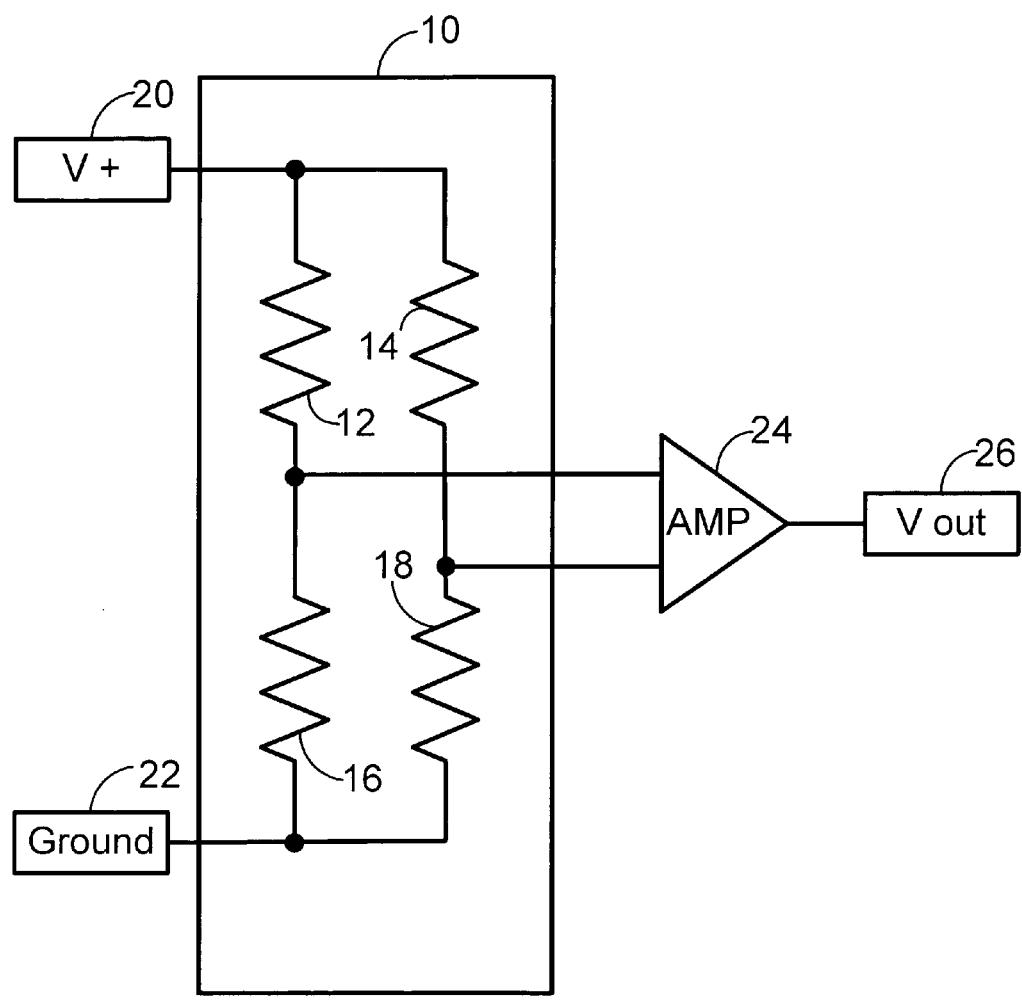
FIG. 1 illustrates a prior art magnetic sensor unit with four resistors arranged in a Wheatstone bridge configuration.
Figure 2:
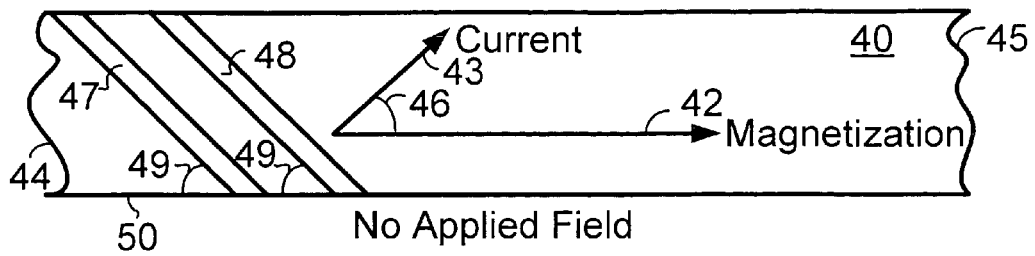
FIG. 2 illustrates a prior art plan view of a strip of magnetoresistive material with no magnetic field applied to the strip.
Figure 3:
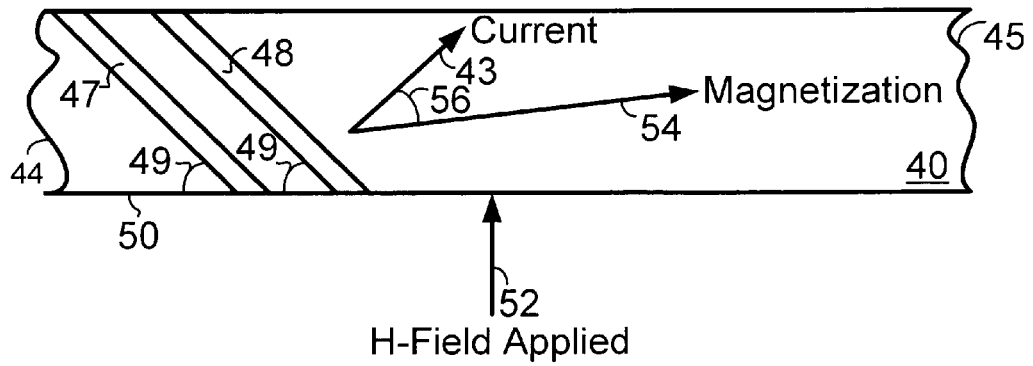
FIG. 3 illustrates a prior art plan view of a strip of magnetoresistive material with a magnetic field applied to the strip.

The first biasing means, such as the use of conductive straps arranged on magnetoresistive strips, may be configured to provide a positive bias or a negative bias to a magnetoresistive strip. In FIG. 3, with the magnetic field 52 applied as shown, the conductive straps 47, 48 provide a positive bias that decreases the angle between the magnetization vector 54 and the current 43. The decrease in the angle is shown as angle 56 being smaller than angle 46 in FIG. 2, where no magnetic field is applied to the strip 40. The positive bias increases the resistance of the magnetoresistive strip 40.

One or more additional conductive straps (not shown) could be arranged to provide a negative bias by placing the one or more additional conductive straps, across a second magnetoresistive strip (not shown), in a direction that is perpendicular to the conductive straps 47, 48 used for positive bias with magnetoresistive strip 40. Applying a negative bias with the additional conductive straps on the second magnetoresistive strip and the magnetic field 52 also applied in a direction normal to a long side of the second magnetoresistive strip could increase an angle between a magnetization vector in the second magnetoresistive strip and a current passing through the second magnetoresistive strip. The negative bias decreases the resistance of the second magnetoresistive strip when the magnetic field 52 is applied to the second magnetoresistive strip in the same direction as applied to the magnetoresistive strip 40 for the positive bias above.

Arranging the first biasing means so that (i) a positive bias is applied to bridge elements 280, 284, and (ii) a negative bias is applied to bridge elements 282, 286 provides a first canceling effect that comprises the component of the magnetic field in a first parallel direction 274 canceling the component of the magnetic field in a second parallel direction 278. In this regard, the output of the third magnetic sensor unit 208 provided at bonding pads 290, 292 comprises substantially only the component of the magnetic field in orthogonal direction 276.

The exemplary integrated three-dimensional magnetic sensing device shown in FIGS. 6 and 7 could also comprise at least four sloped surfaces including sloped surfaces 212, 214 as well as third and fourth sloped surfaces (not shown). Preferably, the third and fourth sloped surfaces would be sloped with respect to surface 210, surface 216, and the common plane 218. In this regard, the third magnetic sensor unit 208 could be arranged so that each of the at least four sloped surface have at least one magnetoresistive strip deposited on its surface. Interconnections could be used to couple the magnetoresistive strips deposited on the at least four sloped surfaces to form an electrical circuit, such a circuit in a Wheatstone bridge configuration.

Figure 8:
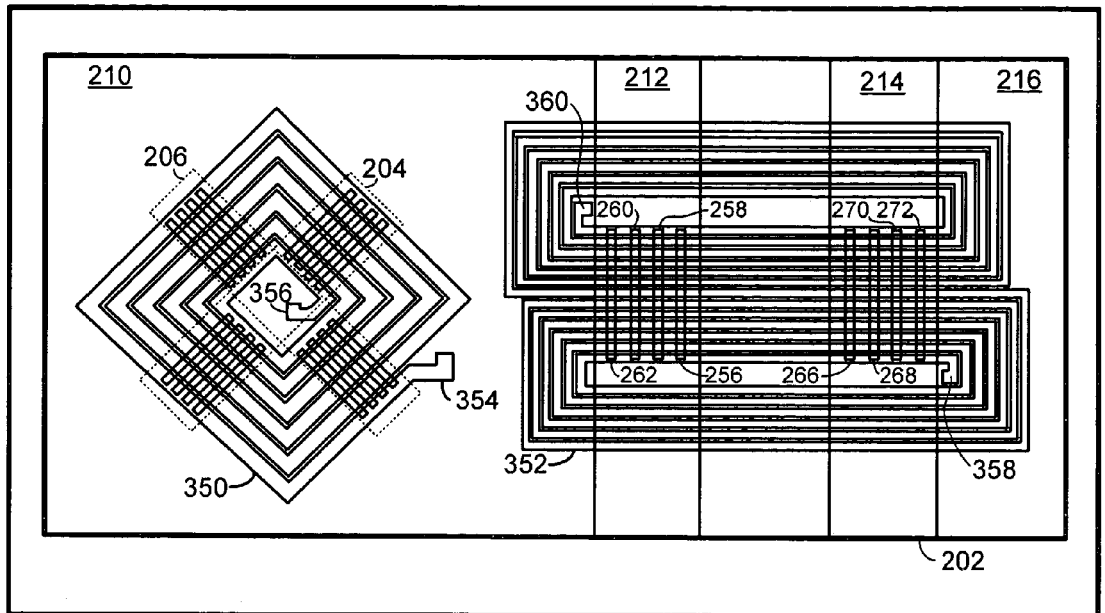
FIG. 8 illustrates a plan view with additional details of the exemplary integrated three-dimensional magnetic sensing device shown in FIG. 6.
Figure 9:
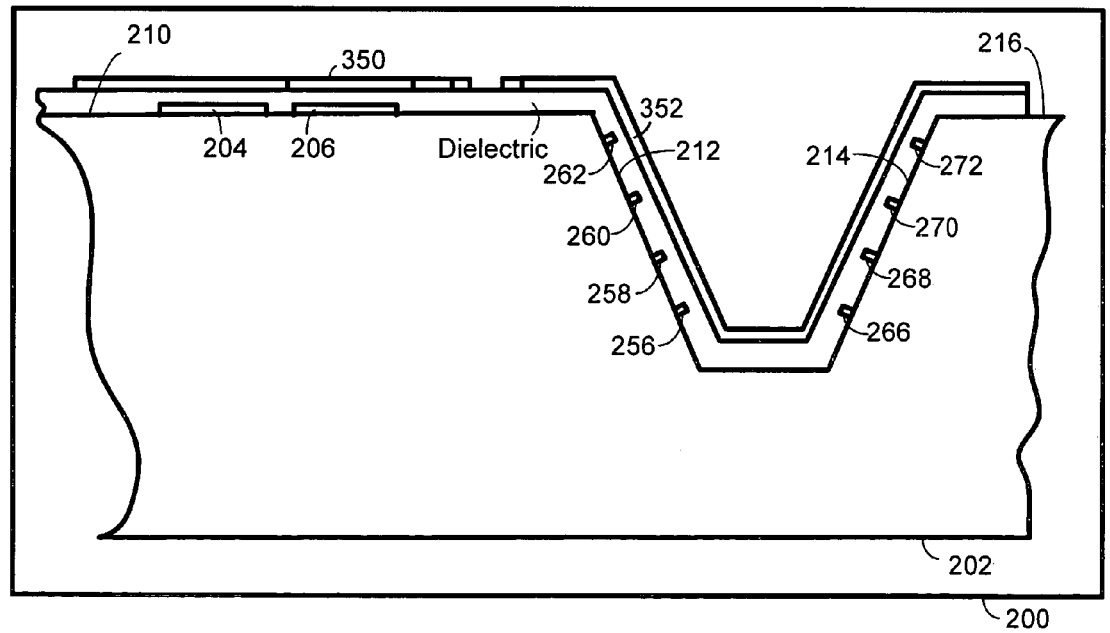
FIG. 9 illustrates a sectional view of the exemplary integrated three-dimensional magnetic sensing device shown in FIG. 8.

FIGS. 8 and 9 illustrate additional details of the exemplary integrated three-dimensional magnetic sensing device 200 that were not shown in FIGS. 6 and 7. In particular, the integrated three-dimensional magnetic sensing device 200 is shown to have (i) a second biasing means 350 for the first and second magnetic sensor units 204 and 206, and (ii) a second biasing means 352 for the third magnetic sensor unit 208 that comprises magnetoresistive strips 256, 258, 260, 262, 266, 268, 270, 272. To improve clarity of FIGS. 8 and 9, the first biasing means (conductive straps in the exemplary embodiment) is not shown.

The second biasing means 350 provides a bias in the first and second magnetic sensing devices 204, 206 by changing the direction of a magnetization vector for the four bridge elements in each of the first and second magnetic sensing devices 204 and 206. The second biasing means 352 provides a bias in the third magnetic sensing device 208 by changing the direction of a magnetization vector for the four bridge elements in each of the third magnetic sensing device 208. By way of example, the second biasing means 352 could change the magnetization vector in the four bridge elements 280, 282, 284, 286 of the third magnetic sensor unit 208. The biasing means 352 could also change the magnetization vector in each magnetoresistive strip of the four bridge elements 280, 282, 284, 286 of the third magnetic sensor unit 208.

The second biasing means 350 is a conductor that extends from bonding pad 354 in a clockwise four-sided spiral form and terminates at bonding pad 356. A current could pass in a first direction through the second biasing means 350 from bonding pad 356 to bonding pad 354. A current in the first direction through the second biasing means 350 sets magnetization vectors of the first and second magnetic sensor units 204, 206 in a first direction.

A current could also pass in a second direction through the second biasing means 350 from bonding pad 354 to bonding pad 356. A current in the second direction through the second biasing means 350 sets magnetization vectors of the first and second magnetic sensor units 204, 206 in a second direction. Bonding pads 354, 356 could be coupled to a power source in order to provide currents in the first and second directions through the second biasing means 350.

One or more layers of a dielectric material electrically separate the first and second magnetic sensor units 204, 206 from the first biasing means 350. The dielectric material may be silicon dioxide or chosen from the many known dielectrics in the art.

The second biasing means 352 for the third magnetic sensor 208 on the sloped surfaces is a conductor that extends from pad 358 in a counter-clockwise four-sided spiral form that leads to a clockwise four-sided spiral form that leads to pad 360. A current could pass in a first direction through the second biasing means 352 from bonding pad 358 to bonding pad 360. A current in the first direction through the second biasing means 352 sets magnetization vectors of the third magnetic sensor unit 208 in a first direction.

A current could also pass in a second direction through the second biasing means 352 from bonding pad 360 to bonding pad 358. A current in the second direction through the second biasing means 352 sets magnetization vectors of the third magnetic sensor unit 208 in a second direction. Bonding pads 358, 360 could be coupled to a power source in order to provide currents in the first and second directions through the second biasing means 352.

One or more layers of dielectric material electrically separate the third magnetic sensor unit 208 from the second biasing means 352.

The first and second biasing means 350, 352 each comprise a conductor that may be of copper, aluminum, or another conducting material. The first and second biasing means 350, 352 may be arranged in a variety of ways. For example, the first and second biasing means 350, 352 could each comprise a wide conductor that covers the magnetoresistive strips in one pass without any clockwise or counter-clockwise forms. The second biasing means in the form of a wide conductor requires a greater amount of current as compared to the amount of current required for a second biasing means that comprises a conductor with multiple narrow strips to provide coverage over the magnetoresistive strips.

A third biasing means, not shown in FIGS. 6, 7, 8, and 9, could also be used with the exemplary integrated three-dimensional magnetic sensing device 200. The third biasing means compensates for offset inherent in the exemplary integrated three-dimensional magnetic sensing device 200. The offset could result from manufacturing imperfections that result in the bridge elements, in the first, second or third magnetic sensing devices 204, 206, 208, being unbalanced and/or non-symmetrical. For example, imperfections between the magnetoresistive strip 256 and a corresponding magnetoresistive strip 266 may include the strips 256, 266 being of different dimensions (e.g., different thickness, width, and/or height).

The third biasing means comprises conductive straps parallel and overlaying the magnetic strips in the exemplary integrated three-dimensional magnetic sensing device 200. The conducting straps in the third biasing means could be copper, aluminum, or some other conductive material. A layer of dielectric material could be placed between the second and third biasing means.

Figure 10:
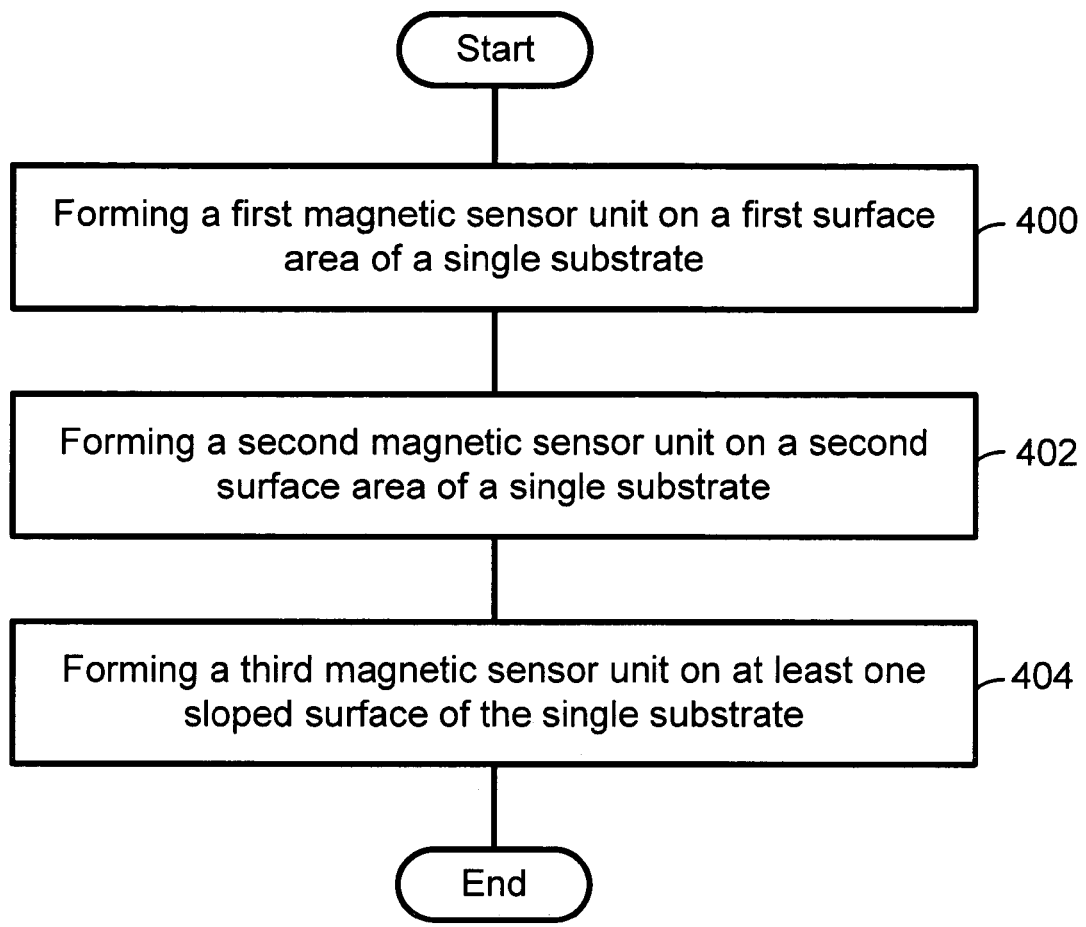
FIG. 10 is a flow chart depicting functions for fabricating a three-dimensional magnetic sensing device.

4. Exemplary Method of Fabricating an Integrated Three-Dimension Magnetic Sensing Device FIG. 10 illustrates a set of functions that should be implemented to fabricate an integrated three-dimension magnetic sensing device. Block 400 includes forming a first magnetic sensor unit 204 on a first surface area of a single substrate. Block 402 includes forming a second magnetic sensor unit 206 on a second surface area of the single substrate.

Preferably the first and second surface areas are in a common plane 218 or at least in parallel planes. The first and second surface areas could comprise (i) at least in part a common area, such as surface 210, and/or (ii) at least partially a common boundary defining the first and second areas. Alternatively, the first surface area could be located remotely from the second surface area.

Forming the first magnetic sensor unit 204 at Block 400 could include depositing a first set of magnetoresistive strips 224, 226, 230, 232, 236, 242, 250, 252 on the first surface area 210, depositing a first set of conductive straps, such as a set of straps including conductive strap 253, on the first set of magnetoresistive strips, and coupling interconnections, such as 234 and 238, to the first set of magnetoresistive strips to form a first resistor bridge network. The first set of conductive straps are arranged to form a 45° angle with respect to the first set of magnetoresistive strips in order to provide a linear operating range for the first set of magnetoresistive strips.

The depositing and coupling functions could occur using any suitable integrated circuit fabrication technique. A resistor bridge network comprises an electrical circuit arranged in a bridge configuration such as a Wheatstone bridge configuration.

Forming the second magnetic sensor unit at Block 402 could include depositing a second set of magnetoresistive strips on the second surface area, depositing a second set of conductive straps on the second set of magnetoresistive strips, and coupling interconnections to the second set of magnetoresistive strips to form a second resistor bridge network. The second set of conductive straps are arranged to form a 45° angle with respect to the second set of magnetoresistive strips in order to provide a linear operating range for the second set of magnetoresistive strips.

Block 404 includes forming a third magnetic sensor unit on at least one sloped surface of the single substrate. The at least one sloped surface is sloped with respect to the first and second surface areas.

Forming the third magnetic sensor unit at Block 404 could include depositing a third set of magnetoresistive strips 256, 258, 260, 262, 266, 268, 270, 272 on the at least one sloped surface area 212 and 214, depositing a third set of conductive straps, such as a set of conductive straps including conductive strap 288, on the third set of magnetoresistive strips, and coupling interconnections to the third set of magnetoresistive strips to form a third resistor bridge network. The third set of conductive straps, including conductive strap 288, are arranged to form a 45° angle with respect to the third set of magnetoresistive strips in order to provide a linear operating range for the third set of magnetoresistive strips.

The first magnetic sensor units 204 is arranged on the first surface area, the second magnetic sensor unit 206 is arranged on the second surface area, and the third magnetic sensor unit 208 is arranged on the at least one sloped surface (212 and/or 214) so that the first, second, and third magnetic sensor units 204, 206, 208 sense magnetic field components in mutually orthogonal directions such as the x-axis direction 220, the y-axis direction 222, and the z-axis direction 223.

Fabricating the integrated three-dimension magnetic sensing device could also involve forming the at least one sloped surface (212 and/or 214) using any of a variety of integrated circuit fabrication techniques. For example, the at least one sloped surface (212 and/or 214) could be formed by techniques that comprise (i) etching material from the single substrate, such as a semiconductor chip, or (ii) by depositing material upon the single substrate to create the at least one sloped surface (212 and/or 214). An example of an etching technique is an etching process known as KOH etching, which uses potassium hydroxide, in part, to remove material from the semiconductor chip. Other etching processes are also available for forming the at least one sloped surface (212 and/or 214).

Fabricating the integrated three-dimension magnetic sensing device could further involve arranging one or more conductors such as the second biasing means 350 in proximity to the first and second magnetic sensor units 204, 206, and the second biasing means 352 in proximity to the third magnetic sensor unit 208. The second biasing means 350, 252 provide a second bias to the first and second magnetic sensor units 204 and 206, and the third magnetic sensor unit 208, respectively. Passing a current through the second biasing means 350 aligns magnetization vectors in the first and second magnetic sensor units 204 and 206. Passing a current through the second biasing means 352 aligns magnetization vectors in the third magnetic sensor unit 208. The process of arranging the one or more second biasing means 350, 352 could involve depositing one or more layers of dielectric material between the first, second, and third magnetic sensor units 204, 206, 208 and the one or more second biasing means 350, 352.

Fabricating the integrated three-dimensional magnetic sensing device could also involve arranging the third biasing means in the sensing device by depositing at least one additional layer of dielectric material and conductive straps over the second bias means.

The order in which the functions above are implemented is not necessarily following the order of description. For example, the slopes could be etched first and then the Permalloy, first bias metal, dielectric, the second bias metal, dielectric, the third bias metal could be deposited consecutively and at the same time for all three sensors 204, 206 and 352.

5. Conclusion

Exemplary embodiments of the present invention have been described above. Those skilled in the art will understand, however, that changes and modifications may be made to the embodiments described without departing from the true scope and spirit of the present invention, which is defined by the claims.

We claim:

1. An integrated three-dimensional magnetic sensing device comprising:
    a first magnetic sensor unit formed on a first surface area of a single substrate;
    a second magnetic sensor unit formed on a second surface area of the single substrate; and
    a third magnetic sensor unit formed at least in part on a first sloped surface and a second sloped surface, wherein the first and second sloped surfaces are sloped with respect to the first and second surface areas of the single substrate,
    wherein the first magnetic sensor unit is arranged to sense a component of a magnetic field in a first direction, the second magnetic sensor unit is arranged to sense a component of the magnetic field in a second direction, and the third magnetic sensor unit is arranged to sense a component of the magnetic field in a third direction, and
    wherein the first, second, and third directions are substantially mutually orthogonal.

2. The integrated three-dimensional magnetic sensing device of claim 1, wherein the first and second surface areas of the single substrate are within a common plane.

3. The integrated three-dimensional magnetic sensing device of claim 1, wherein the first and second surface areas of the single substrate are in substantially parallel planes.

4. The integrated three-dimensional magnetic sensing device of claim 1,
    wherein the first magnetic sensor unit comprises a first plurality of magnetoresistive strips and a first set of interconnections to couple the first plurality of magnetoresistive strips as a first electrical circuit,
    wherein the second magnetic sensor unit comprises a second plurality of magnetoresistive strips and a second set of interconnections to couple the second plurality of magnetoresistive strips as a second electrical circuit, and
    wherein the third magnetic sensor unit comprises a third plurality of magnetoresistive strips and a third set of interconnections to couple the third plurality of magnetoresistive strips as a third electrical circuit.

5. The integrated three-dimensional magnetic sensing device of claim 4,
    wherein the first electrical circuit is arranged as a first Wheatstone bridge, wherein the second electrical circuit is arranged as a second Wheatstone bridge, and the third electrical circuit is arranged as a third Wheatstone bridge, wherein the third Wheatstone bridge comprises first, second, third, and fourth bridge elements.

6. The integrated three-dimensional magnetic sensing device of claim 5, wherein the third magnetic sensor unit further comprises a biasing means selected to change an angle between a current in the first, second, third, and fourth bridge elements and a direction of magnetization in the first, second, third, and fourth bridge elements to provide linear operation.

7. The integrated three-dimensional magnetic sensing device of claim 6, wherein the biasing means comprises conductive straps extending across at least a portion of the first, second, third, and fourth bridge elements at an angle of approximately 45°.

8. The integrated three-dimensional magnetic sensing device of claim 7,
    wherein the third magnetic sensor unit further comprises an output for outputting a signal and the third magnetic sensor unit further senses a component of the magnetic field in a fourth direction, and wherein the biasing means is arranged to provide a positive bias in the first and third bridge elements and a negative bias in the second and fourth bridge elements in order to cancel the component of the magnetic field in the fourth direction so that the output signal does not include the component of the magnetic field in the fourth direction.

9. The integrated three-dimensional magnetic sensing device of claim 1, further comprising third and fourth surfaces sloped with respect to the first and second surface areas of the single substrate; wherein the third magnetic sensor unit comprises a first magnetoresistive strip at the first sloped surface, a second magnetoresistive strip at the second sloped surface, a third magnetoresistive strip at the third sloped surface, and a fourth magnetoresistive strip at the fourth sloped surface, and interconnections to couple first, second, third, and fourth magnetoresistive strips as an electrical circuit.

10. The integrated three-dimensional magnetic sensing device of claim 9, wherein the third magnetic sensor unit further comprises a first biasing means selected to change an angle between a current in the first, second, third, and fourth bridge elements and a direction of magnetization in the first, second, third, and fourth bridge elements to provide linear operation.

11. The integrated three-dimensional magnetic sensing device of claim 10 further comprising a second biasing means selectable to change the direction of magnetization in the first, second, third, and fourth bridge elements.

12. The integrated three-dimensional magnetic sensing device of claim 11,
wherein the first biasing means comprises conductive straps at least a portion of the first, second, third, and fourth bridge elements at an angle of approximately 45°,
wherein the second biasing means comprises a conductor in proximity to the first, second, third, and fourth bridge elements, and
wherein the conductor comprises first and second ends, and
wherein the conductor is coupled to at least one power source so that conductor can pass current in a direction from the first end to the second end and in a direction from the second end to the first end.

13. An integrated three-dimensional magnetic sensing device comprising:
a monolithic substrate defining (i) a plane of the sensing device, (ii) a first surface parallel to the plane, and (iii) second and third surfaces sloped with respect to the first surface;
a first magnetic sensor formed at the first surface for producing a first output signal that represents a magnetic field component in a first direction, wherein the first direction is substantially parallel to the plane;
a second magnetic sensor formed at the first surface for producing a second output signal that represents a magnetic field component in a second direction, wherein the second direction is substantially parallel to the plane and wherein the second direction is substantially orthogonal to the first direction; and
a third magnetic sensor formed at least in part on the second and third surfaces for producing a third output signal that represents a magnetic field component in a third direction, wherein the third direction is substantially orthogonal to the first surface.

14. The integrated three-dimensional magnetic sensing device of claim 13,
wherein the first magnetic sensor comprises a first plurality of magnetoresistive strips arranged as a first bridge circuit;
wherein the second magnetic sensor comprises a second plurality of magnetoresistive strips arranged as a second bridge circuit; and
wherein the third magnetic sensor comprises a third bridge circuit having at least a first magnetoresistive strip at the second surface and at least a second magnetoresistive strip at the third surface.

15. The integrated three-dimensional magnetic sensing device of claim 14, wherein the first, second, and third bridge circuits are arranged as Wheatstone bridge circuits.

16. A method of fabricating an integrated three-dimensional magnetic sensing device, the method comprising:
forming a first magnetic sensor unit on a first surface area of a single substrate, wherein forming the first magnetic sensor unit comprises depositing a first set of magnetoresistive strips on the first surface area and depositing a first set of conductive straps on the first set of magnetoresistive strips:
forming a second magnetic sensor unit on a second surface area of the single substrate, wherein forming the second magnetic sensor unit comprises depositing a second set of magnetoresistive strips on the second surface area and depositing a second set of conductive straps on the second set of magnetoresistive strips;
etching the single substrate to form at least one sloped surface, wherein the at least one sloped surface is sloped with respect to the first and second surface areas,
forming a third magnetic sensor unit on the at least one sloped surface of the single substrate, wherein forming the third magnetic sensor unit comprises depositing a third set of magnetoresistive strips on the at least one sloped surface and depositing a third set of conductive straps on the third set of magnetoresistive strips;
coupling interconnections to the first set of magnetoresistive strips to form a first resistor bridge network;
coupling interconnections to the second set of magnetoresistive strips to form a second resistor bridge network;
coupling interconnections to the third set of magnetoresistive strips to form a third resistor bridge network; and
arranging a conductor in proximity to the third magnetic sensor unit,
wherein passing a current through the conductor aligns a magnetization vector of the third magnetic sensor unit,
wherein forming the first, second, and third magnetic sensor units comprises arranging the first, second, and third magnetic sensor units respectively so that the first, second, and third magnetic sensor units sense magnetic field components in mutually orthogonal directions,
wherein the first, second, and third sets of conductive straps are arranged to form angles of approximately 45 degrees with respect to the first, second, and third sets of magnetoresistive strips respectively, and
wherein the first, second, and third sets of conductive straps provide a linear operating range for the first, second, and third sets of magnetoresistive strips.

17. The method of claim 16, wherein etching the single substrate comprises etching a single semiconductor chip via KOH etching.

18. A method of fabricating an integrated three-dimensional magnetic sensing device, the method comprising:

forming on a single substrate a first sloped surface and a second sloped surface, wherein the first sloped surface is opposite the second sloped surface, and wherein an angle of the first sloped surface is substantially equal to an angle of the second sloped surface;

forming a first magnetic sensor unit on a first surface area of the single substrate;

forming a second magnetic sensor unit on a second surface area of the single substrate;

forming a third magnetic sensor unit on the first and second sloped surfaces of the single substrate, wherein the first and second sloped surfaces are sloped with respect to the first and second surface areas, and arranging a biasing means on the third magnetic sensor unit, whereby the biasing means provides a cancelling effect on horizontal components of a magnetic field such that the third magnetic sensor unit is sensitive to only vertical components of the magnetic field.

19. The method of claim 18, wherein the function of forming the first sloped surface and the second sloped surface is carried out using KOH etching.

20. The method of claim 18,
wherein forming the third magnetic sensor unit further comprises depositing a set of magnetoresistive strips on the first and second sloped surfaces, and
wherein the biasing means comprises conductive strips placed on the set of magnetoresistive strips.

21. A method of fabricating an integrated three-dimensional magnetic sensing device, the method comprising:

forming a first magnetic sensor unit on a first surface area of a single substrate;

forming a second magnetic sensor unit on a second surface area of the single substrate; and forming a third magnetic sensor unit on at least one sloped surface of the single substrate, wherein the at least one sloped surface is sloped with respect to the first and second surface areas, wherein forming the first, second, and third magnetic sensor units comprises arranging the first, second, and third magnetic sensor units respectively so that the first, second, and third magnetic sensor units sense magnetic field components in mutually orthogonal directions, wherein the at least one sloped surface of the single substrate comprises a first sloped surface and a second sloped surface, wherein the first sloped surface is opposite the second sloped surface, wherein an angle of the first sloped surface is substantially equal to an angle of the second sloped surface, and wherein the third magnetic sensor unit includes a biasing means that provides a cancelling effect on horizontal components of a magnetic field such that the third magnetic sensor unit is sensitive to only vertical components of the magnetic field.

* * * * *